United States Patent
Chung et al.

(10) Patent No.: US 9,490,403 B2
(45) Date of Patent: Nov. 8, 2016

(54) COLOR CONVERTING ELEMENT AND LIGHT EMITTING DEVICE INCLUDING THE SAME

(71) Applicants: POSTECH ACADEMY—INDUSTRY FOUNDATION, Pohang-si (KR); SEOUL VIOSYS CO., LTD., Ansan-si (KR); POSCO LED COMPANY LTD., Seongnam-si (KR)

(72) Inventors: Woon Jin Chung, Cheonan-si (KR); Ka Ram Han, Cheongju-si (KR); Yi Kwon Lee, Cheonan-si (KR)

( * ) Notice: Subject to any disclaimer, the term of this patent is extended or adjusted under 35 U.S.C. 154(b) by 0 days.

(21) Appl. No.: 14/666,178

(22) Filed: Mar. 23, 2015

(65) Prior Publication Data

US 2015/0194579 A1     Jul. 9, 2015

Related U.S. Application Data

(63) Continuation-in-part of application No. PCT/KR2013/008457, filed on Sep. 17, 2013.

(30) Foreign Application Priority Data

Sep. 21, 2012  (KR) .................. 10-2012-0105102

(51) Int. Cl.
*H01L 33/36*     (2010.01)
*H01L 33/50*     (2010.01)
(Continued)

(52) U.S. Cl.
CPC ............. *H01L 33/508* (2013.01); *C03B 19/06* (2013.01); *C03C 4/12* (2013.01); *C03C 14/006* (2013.01); *C09K 11/08* (2013.01); *H01L 33/24* (2013.01);
(Continued)

(58) Field of Classification Search
None
See application file for complete search history.

(56) References Cited

U.S. PATENT DOCUMENTS 8,203,157 B2 * 6/2012 Suzuki .................. H01L 33/504
                                              257/440
2009/0101930 A1 * 4/2009 Li .......................... F21K 9/135
                                              257/98

(Continued)

FOREIGN PATENT DOCUMENTS

JP       2011-520281 A      7/2011
KR    10-2011-0117415 A    10/2011

OTHER PUBLICATIONS

Korean Intellectual Property Office, International Search Report and Written Opinion, International Application No. PCT/KR2013/008457, Dec. 27, 2013, 11 pages.

*Primary Examiner* — Alexander Ghyka
(74) *Attorney, Agent, or Firm* — Perkins Coie LLP

(57) ABSTRACT

Disclosed are a color converting element and a method for manufacturing the color converting element. The disclosed color converting element includes: first wavelength conversion cells spaced apart from one another; and second wavelength conversion cells arranged among the first wavelength conversion cells. The first and second wavelength conversion cells are made of a material containing glass. The color converting element of the disclosed technology is configured in that color converting cells having different color converting characteristics are periodically arranged, when the color converting element is applied to a color converting glass material which may improve thermal and chemical durability of white LEDs, thus minimizing the degradation of efficiency or luminance caused by an interaction between color converting phosphors or active ions and allowing for ease of adjustment of color rendering index.

17 Claims, 6 Drawing Sheets

(51) Int. Cl.
*C09K 11/08* (2006.01)
*C03B 19/06* (2006.01)
*H01L 33/24* (2010.01)
*H01L 33/46* (2010.01)
*C03C 4/12* (2006.01)
*C03C 14/00* (2006.01)

(52) U.S. Cl.
CPC ............... *H01L 33/36* (2013.01); *H01L 33/46* (2013.01); *H01L 33/504* (2013.01); *H01L 33/505* (2013.01); *H01L 2933/0041* (2013.01)

(56) References Cited

U.S. PATENT DOCUMENTS

| | | | |
|---|---|---|---|
| 2009/0219225 A1* | 9/2009 | Cope | G09F 9/30 345/55 |
| 2009/0272998 A1* | 11/2009 | Berben | H01L 33/508 257/98 |
| 2010/0182471 A1* | 7/2010 | Toda | H01L 27/14645 348/294 |
| 2011/0133628 A1* | 6/2011 | Klein | H01L 51/5036 313/483 |
| 2013/0003368 A1* | 1/2013 | Li | H04N 9/3114 362/231 |
| 2013/0222553 A1* | 8/2013 | Tsuchita | H01L 27/14627 348/49 |
| 2014/0211295 A1* | 7/2014 | Maxik | G02B 26/0833 359/291 |
| 2014/0347860 A1* | 11/2014 | Yang | F21V 9/16 362/293 |
| 2015/0155450 A1* | 6/2015 | Oka | H01L 33/504 257/98 |
| 2015/0159836 A1* | 6/2015 | Tamaki | B05D 5/06 362/84 |

* cited by examiner

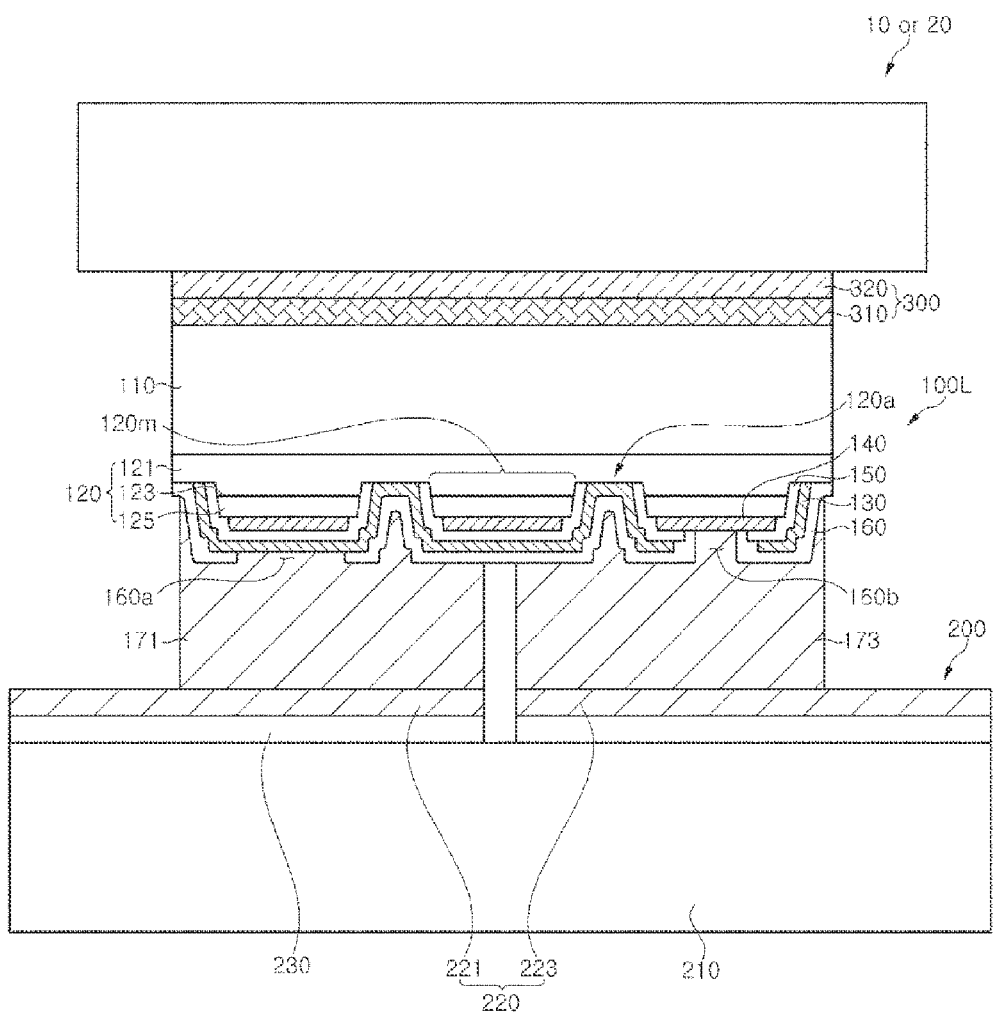

— 1 —
COLOR CONVERTING ELEMENT AND LIGHT EMITTING DEVICE INCLUDING THE SAME

PRIORITY CLAIMS AND CROSS-REFERENCES TO RELATED APPLICATIONS

This patent document is a continuation-in-part of, and claims priority and the benefits of, a Patent Cooperation Treaty (PCT) application number PCT/KR2013/008457, entitled "COLOR CONVERTING ELEMENT AND METHOD FOR MANUFACTURING THE SAME" and filed with the Korean Intellectual Property Office (KIPO) on Sep. 17, 2013, which further claims priority and the benefits of Korean patent application number 10-2012-0105102 entitled "COLOR CONVERSION ELEMENT AND FABRICATION METHOD OF THE SAME" filed with KIPO on Sep. 21, 2012. The contents of both PCT application PCT/KR2013/008457 and Korean application 10-2012-0105102 are incorporated by reference in their entirety.

TECHNICAL FIELD

The disclosure of this patent document relates to a white light emitting diode including a color converting element and a method for manufacturing the same.

BACKGROUND

A white light emitting diode (LED) is generally composed of a blue LED and a color converting element which absorbs blue light emitted from the blue LED and emits white light through luminescence of yellow or green light and red light. For a typical white LED commercially available in the art, the color converting element is prepared by dispersing phosphors, such as silicate phosphors, garnet phosphors including YAG, fluoride phosphors, sulfide phosphors, or nitride phosphors, in resin or a silicone resin, and is deposited onto a blue LED.

SUMMARY

Various implementations of the disclosed technology provide a color converting element, which can minimize deterioration in efficiency and brightness caused by interaction between the color converting elements while improving color rendering characteristics and spectral characteristics of a color converting glass material for high power white LEDs, an LED including the color converting element, and a method for manufacturing the color converting element.

Embodiments of the disclosed technology provide a color converting element, in which color converting glass materials having different color conversion wavelengths are arranged in a predetermined pattern. In some implementations, when a blue LED is used, green and red phosphors or yellow and red phosphors are used. In some implementations, when a UV LED is used, blue, green and red phosphors or active ion-containing glass or crystallized glass materials are used. Various implementations of the disclosed technology also provide a light emitting device including the color converting element, and a method for manufacturing the color converting element.

In accordance with one aspect of the disclosed technology, a color converting element is provided to include: a plurality of first wavelength conversion cells separated from one another; and a plurality of second wavelength conversion cells each disposed between the first wavelength conversion cells, wherein the first and second wavelength conversion cells are composed of or include a glass containing material.

In some implementations, the color converting element may further include a plurality of third wavelength conversion cells separated from one another and disposed between the first wavelength conversion cells and between the second wavelength conversion cells, wherein the third wavelength conversion cells are composed of or include a glass containing material.

In some implementations, the first and second wavelength conversion cells have the same height.

In some implementations, each of the first and second wavelength conversion cells has side surfaces, and each of the side surfaces of a given first wavelength conversion cell adjoins a side surfaces of a corresponding second wavelength conversion cell.

In some implementations, the first and second wavelength conversion cells are arranged in a stripe pattern or in a lattice pattern.

In some implementations, the first and second wavelength conversion cells may be formed to have the same width or different widths less than or equal to 300 µm. While a smaller width of the wavelength conversion cells provides some advantageous, the width of the wavelength conversion cells is not limited to a particular lower limit so long as the width can be obtained by a process.

In some implementations, the glass-containing material includes a ceramic phosphor-containing glass or crystallized glass material, or an active ion for color conversion, quantum dot or nanocrystal-containing glass or crystallized glass material.

In some implementations, the glass-containing material has a particle size of 100 µm or less.

In accordance with another aspect of the disclosed technology, a light emitting diode is provided to include: an LED light source, and a color converting element converting a color of light emitted from the LED light source, wherein the color converting element includes: a plurality of first wavelength conversion cells separated from one another; and a plurality of second wavelength conversion cells each disposed between the first wavelength conversion cells, and the first and second wavelength conversion cells are composed of a glass containing material.

In some implementations, the color converting element may further include a plurality of third wavelength conversion cells separated from one another and disposed between the first wavelength conversion cells and between the second wavelength conversion cells, and the third wavelength conversion cells are composed of or include a glass containing material.

In accordance with another aspect of the disclosed technology, a method for manufacturing a color converting element is provided to include: forming a first color converting element including a first material containing glass and having a first convex-concave pattern on one surface thereof; forming a second color converting element including a second material containing glass and having a second convex-concave pattern formed on one surface thereof and engaging with the first convex-concave pattern; and partially removing the first and second color converting elements such that the remained engaging portion of the first and second convex-concave patterns has exposed top and bottom surfaces.

In some implementations, the forming of the first color converting element having the first convex-concave pattern includes compressing powder of the first material in molds having the first convex-concave pattern, and the forming of the second color converting element having the second convex-concave pattern includes placing powder of the second material on the first convex-concave pattern of the compressed first color converting element, followed by compressing the powder of the second material.

In some implementations, the method further includes sintering the first color converting element and the second color converting element after forming the second color converting element having the second convex-concave pattern.

In accordance with another aspect of the disclosed technology, a light emitting device is provided to include: a substrate; a light emitting diode disposed on the substrate and including a light emitting structure including a first conductive type semiconductor layer, a second conductive type semiconductor layer and an active layer disposed between the first conductive type semiconductor layer and the second conductive type semiconductor layer; and a color converting element disposed on the light emitting diode, wherein the light emitting structure has an elongated shape extending in a first direction and includes a plurality of mesas having the second conductive type semiconductor layer and the active layer; the color converting element includes a plurality of first wavelength conversion cells separated from one another and a plurality of second wavelength conversion cells each disposed between the first wavelength conversion cells, and at least one of interfaces between the first wavelength conversion cells and the second wavelength conversion cells has an elongated shape extending in a second direction; and the first direction is not parallel to the second direction.

In some implementations, the first and second wavelength conversion cells may be arranged in a stripe pattern.

In some implementations, the first direction may be substantially perpendicular to the second direction.

In some implementations, the first and second wavelength conversion cells may be arranged in a lattice pattern.

In some implementations, the color converting element may have a greater horizontal cross-sectional area than an upper surface of the light emitting diode.

In some implementations, the upper surface of the light emitting diode may be covered by the color converting element.

In some implementations, the first and second wavelength conversion cells may include a glass containing material.

In some implementations, the glass containing material may include a ceramic phosphor-containing glass or crystallized glass material.

In some implementations, the glass containing material may include an active ion for color conversion, quantum dot or nanocrystal-containing glass or crystallized glass material.

In some implementations, the color converting element may further include a plurality of third wavelength conversion cells separated from one another, and each of the third wavelength conversion cells may be disposed between the first wavelength conversion cells and the second wavelength conversion cells.

In some implementations, the light emitting diode may include a first contact electrode and a second contact electrode disposed over the light emitting structure and forming ohmic contact with the first and second conductive type semiconductor layers, respectively; an insulation layer insulating the first contact electrode and the second contact electrode while partially covering the first and second contact electrodes; and first and second pad electrodes disposed over the insulation layer and electrically connected to the first and second contact electrodes, respectively.

In some implementations, the second contact electrode may be disposed over the mesas.

In some implementations, the first contact electrode may form ohmic contact with the first conductive type semiconductor layer around the mesas, and an ohmic contact area between the first contact electrode and the first conductive type semiconductor layer may have an elongated shape extending in the first direction.

In some implementations, the first and second wavelength conversion cells may have the same or different widths less than or equal to 300 μm.

In some implementations, the light emitting device may further include a distributed Bragg reflector disposed between the color converting element and the light emitting diode.

In some implementations, the distributed Bragg reflector may transmit light emitted from the light emitting diode and reflect light emitted from the color converting element and is subjected to wavelength conversion in the color converting element.

In some implementations, the distributed Bragg reflector may include a first distributed Bragg reflector and a second distributed Bragg reflector disposed on the first distributed Bragg reflector, and the first distributed Bragg reflector may reflect light having a shorter wavelength than the second distributed Bragg reflector.

According to another aspect of the disclosed technology, a light emitting device is provided to include a light emitting source including luminous areas and configured to guide light emitted from the light emitting source to pass through the luminous areas; and a color converting element configured to convert the light emitted from the light emitting source to a target wavelength light, wherein the color converting element includes first wavelength conversion cells including a glass-containing material and second wavelength conversion cells including the glass-containing material, and the first wavelength conversion cells and the second wavelength conversion cells are arranged to form a pattern such that a given one of the first wavelength conversion cells is disposed adjacent to one of the second wavelength conversion cells.

In some implementations, the luminous areas are arranged in a first direction and interfaces between the first wavelength conversion cells and the second wavelength conversion cells are arranged in a second direction that is not parallel to the first direction.

In some implementations, the glass-containing material has a particle size of 100 μm or less.

According to some implementations of the disclosed technology, in applying glass materials for color conversion to improve thermal and chemical durability of a white LED, color converting cells having different color conversion characteristics are periodically arranged. Thus, it is possible to minimize deterioration in efficiency and brightness caused by interaction between color converting phosphors or active ions while allowing easy adjustment of color rendering characteristics.

According to some implementations of the disclosed technology, since color conversion is performed in each color converting cell, it is possible to resolve problems which can occur when using a mixture or stack of color converting elements, while facilitating natural mixing of colors.

BRIEF DESCRIPTION OF DRAWINGS

FIG. 3 is a sectional view of an exemplary light emitting device including a color converting element according to some embodiments of the disclosed technology.

DETAILED DESCRIPTION

Figure 1A:
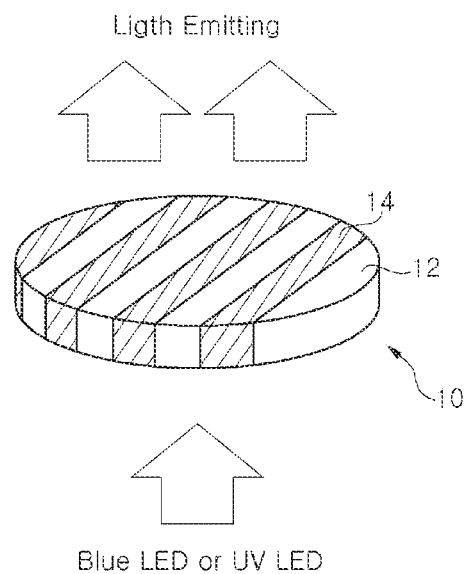
FIG. 1a and FIG. 1b are perspective views of exemplary color converting elements according to some embodiments of the disclosed technology.

A color converting element of a typical white LED includes phosphor containing material such as an organic resin or a silicone. In this case, if the white LED is used for a long period of time, the phosphor-containing material suffers from color change such as a yellowing or browning phenomenon, thereby causing the deterioration in color quality and brightness of the white LED. In addition, the phosphor-containing material is vulnerable to air and moisture, which changes characteristics of active ions promoting color change in the phosphors, thereby causing the decrease in lifespan of the white LED. Such decrease in lifespan negatively affects white LED products. For example, for high power white LED products such as automobile electric components and lamps, of which demands increase in the market, the decrease in lifespan needs to be avoided.

To resolve such a problem, a glass or crystallized glass ceramic material is used as a color converting material for a white LED. The glass or crystallized glass ceramic material contains active ions for color conversion, or phosphors prepared by mixing typical ceramic phosphors with glass frit powder, followed by sintering the mixture. Since such a color converting glass material exhibits far superior chemical or thermal properties to existing organic materials, the color converting glass material prevents the deterioration in brightness and color quality of the white LED and is suitable for high power LED products.

Recently, NEG (Nippon Electric Glass) proposed use of a glass material containing ceramic phosphors as a color converting member on a blue LED to realize a white LED in order to provide a white light source for illumination having high reliability and long lifespan, examples disclosed in a Japanese Patent Laid-open Publication No. 2008-255362. The ceramic phosphors are mixed with the glass frit material, which allows sintering at low temperature, followed by sintering to prepare a sinter, in which color conversion characteristics depend on the ceramic phosphors contained therein. In order to realize white light with this structure, yellow phosphors or green and red phosphors may be used in the glass material for suitable color coordination.

However, since the yellow phosphor lacks a green or red component in the luminescence spectrum, the yellow phosphor has a limit in color realization when used for lighting and backlight units (BLUs). In order to resolve this problem, a mixture of yellow phosphors and red phosphors or a mixture of green phosphors and red phosphors is used in the art. However, this structure has problems such as deterioration in efficiency and color brightness or difficulty in realizing the color coordination due to interaction caused by reabsorption and energy transfer between the yellow and red phosphors or between the green and red phosphors.

In addition, yellow and red phosphor layers may be stacked one above another to improve color rendering characteristics. However, light generated in a lower layer and subjected to color conversion can be scattered by or reabsorbed into an upper layer, thereby causing deterioration in efficiency and brightness.

The disclose technology provides for a novel color converting element and a method for manufacturing the same, which can resolve such problems in the related art.

Hereinafter, embodiments of the disclosed technology will be described in detail with reference to the accompanying drawings. The following embodiments are provided by way of example so as to fully convey the spirit of the disclosed technology to those skilled in the art to which the disclosed technology pertains. Accordingly, the disclosed technology is not limited to the embodiments disclosed herein and may also be implemented in different forms. In the drawings, widths, lengths, thicknesses, and the like of elements may be exaggerated for clarity and descriptive purposes. When an element or layer is referred to as being "above", "over" or "on" another element or layer, it may be "directly above", "directly over" or "directly on" the other element or layer or intervening elements or layers may be present. Throughout the specification, like reference numerals denote like elements having the same or similar functions.

Figure 1B:
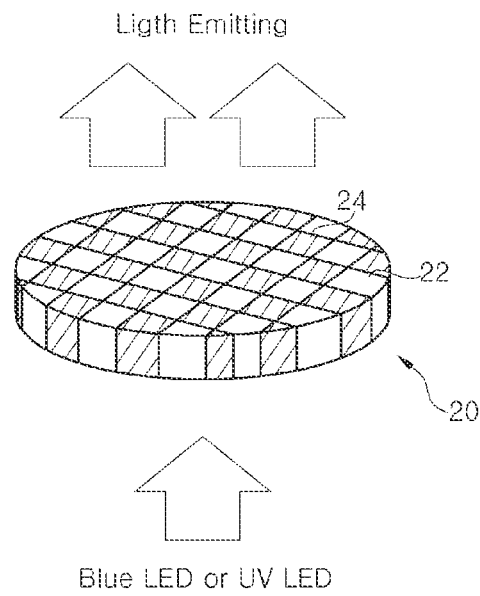

FIG. 1a and FIG. 1b are perspective views of examples of a color converting element according to some embodiments of the disclosed technology. FIG. 1a shows a color converting element 10 in which first wavelength conversion cells 12 and second wavelength conversion cells 14 are arranged in a stripe pattern, and FIG. 1b shows a color converting element 20 in which first wavelength conversion cells 22 and second wavelength conversion cells 24 are arranged in a lattice pattern.

Referring to FIG. 1a and FIG. 1b, the color converting element 10 includes a plurality of first wavelength conversion cells 12 separated from one another and a plurality of second wavelength conversion cells 14 separated from one another. Each of the second wavelength conversion cells 14 is disposed between the first wavelength conversion cells 12. In addition, the first wavelength conversion cells 12 and the second wavelength conversion cells 14 are composed of or include a glass-containing material.

The first wavelength conversion cells 12 and the second wavelength conversion cells 14 have the same height. As shown in FIG. 1a, each of the first wavelength conversion cells 12 and the second wavelength conversion cells 14 has two side surfaces. The first wavelength conversion cells 12 and the second wavelength conversion cells 14 can adjoin together at the respective two side surfaces. For example, each of the two side surfaces of a given first wavelength conversion cell 12 can be adjoined to a side surface of a corresponding second wavelength conversion cell 14. Accordingly, the first wavelength conversion cells 12 and the second wavelength conversion cells 14 are arranged in a stripe pattern, and the side surfaces of the first wavelength conversion cells 12 have the same height as that of the side surfaces of the second wavelength conversion cells 14.

The glass-containing material of the first and second wavelength conversion cells 12 and 14 may include, for example, a ceramic phosphor-containing glass or crystallized glass material, or an active ion for color conversion, quantum dot or nanocrystal-containing glass or crystallized glass material. As an example, the glass-containing material may have a particle size of 100 μm or less. In some implementations, the glass-containing material may have a particle size that is preferably 50 μm or less.

Referring to FIG. 1b, each of the first and second wavelength conversion cells 22 and 24 has four side surfaces. In some implementations, four side surfaces of some first wavelength conversion cells 22 adjoin four second wavelength conversion cells 24, respectively. Accordingly, the first wavelength conversion cells 22 and the second wavelength conversion cells 24 are arranged in a lattice pattern, and the side surfaces of the first wavelength conversion cells 22 have the same height as that of the side surfaces of the second wavelength conversion cells 24.

In FIG. 1b, the first wavelength conversion cells 22 and the second wavelength conversion cells 24 include the glass-containing material which may be or include, for example, a ceramic phosphor-containing glass or crystallized glass material, or an active ion for color conversion, quantum dot or nanocrystal-containing glass or crystallized glass material. As one example, the glass-containing material may have a particle size of 100 μm or less. In some implementations, the glass-containing material may have a particle size that is preferably 50 μm or less.

With the glass-containing material having a particle size of 100 μm or less, the color converting element can be easily formed in a stripe pattern or in a lattice pattern.

The color converting element according to some implementations of the disclosed technology can provide a high power white LED having improved thermal and chemical durability by substantially eliminating use of an organic material. The color converting element may include the wavelength conversion cells having different color conversion characteristics disposed in a periodic arrangement, thereby minimizing deterioration in efficiency and brightness caused by interaction between the color converting phosphors or the active ions while allowing easy adjustment of the color rendering characteristics.

The color converting element according to some implementations of the disclosed technology includes a glass material including ceramic phosphors, or a glass or crystallized glass material including active ions for color conversion, quantum dots, nanoparticles, or the like. Here, the ceramic phosphors include silicate phosphors, garnet phosphors including YAG, fluoride phosphors, sulfide phosphors, or nitride phosphors. The glass material including the ceramic phosphors may satisfy minimizing reaction with the ceramic phosphors, being transparent in the visible wavelength region, exhibiting excellent chemical, thermal or mechanical durability, or permitting sintering at a temperature of 800° C. or less. For example, the glass material may be or include a borate glass material, a phosphate glass material, or a silicate glass material.

The color converting element according to the disclosed technology includes two or more color converting elements, which are different from one another and are sequentially arranged in a pattern including stripe or lattice pattern. With this structure, the color converting element according to the disclosed technology can fundamentally resolve problems which can occur when using a mixture or stack of color converting elements, while facilitating natural mixing of colors.

Referring to FIG. 1a and FIG. 1b, a light emitting diode according to one embodiment of the disclosed technology includes an LED light source, and the color converting element 10 or 20 that converts color of light emitted from the LED light source. The color converting element 10 or 20 includes the plurality of first wavelength conversion cells 12 or 22 separated from one another and the plurality of second wavelength conversion cells 14 or 24 separated from one another and each disposed between the first wavelength conversion cells 12 or 22. The first wavelength conversion cells 12 and the second wavelength conversion cells 14 are composed of or include a glass-containing material In some implementations, the LED light source may include a blue or UV LED, the first wavelength conversion cells 12 or 22 may include yellow or green phosphors, and the second wavelength conversion cells 14 or 24 may include red phosphors.

The color converting element 10 or 20 including the first wavelength conversion cells 12 or 22 and the second wavelength conversion cells 14 or 24 are described in detail above, and thus a repeated description thereof will be omitted.

In this embodiment, the light emitting diode may be configured as a white light emitting diode. In some implementations, the light emitting diode may include a blue LED light source and the color converting element including the wavelength conversion cells including the yellow or red phosphors and the wavelength conversion cells including the red phosphors, and. However, it should be understood that the disclosed technology is not limited thereto. For example, the light emitting diode may include a LED light source and the color converting element including three wavelength conversion cells each including green or yellow, red and blue phosphors. It should be understood that the light emitting diode can include various types of phosphors and LED light sources.

The light emitting diode according to the disclosed technology provides applying glass materials to color conversion to improve thermal and chemical durability of a LED including a white LED. Further, the light emitting diode includes color converting cells having different color conversion characteristics and arranged in a pattern, thereby minimizing deterioration in efficiency and brightness caused by interaction between color converting phosphors or active ions while allowing easy adjustment of color rendering characteristics In some implementations, the LED light source and the color converting element 10 or 20 may be arranged such that a light emitting direction of the LED light source intersects a direction of the arrangement of the color converting element 10 or 20. If the color converting element 10 or 20 is disposed parallel to the light emitting direction of the LED light source, the color converting element and the light source form a stack structure, whereby light generated from a lower portion of the stack structure can be scattered by or reabsorbed into a color conversion layer formed at an upper portion of the stack structure, thereby causing deterioration in color conversion efficiency, brightness, and color rendering characteristics.

In the examples of the color converting element as shown in FIG. 1a and FIG. 1b, each wavelength conversion cell is illustrated as having a stripe shape having a straight cross-section, or a lattice shape having a rectangular cross-section. However, it should be understood that the disclosed technology is not limited thereto and each cell may have any polygonal shape having a triangular, pentagonal or hexagonal cross-section, and the like.

Further, in the color converting element 10 or 20, each of the wavelength conversion cells 12 and 14 may have a width of 300 μm or less to allow suitable mixing of colors. While a smaller width of the wavelength conversion cell provides some advantages, the width of the wavelength conversion cells is not limited to a particular lower limit so long as the width can be obtained by a process. In addition, the wavelength conversion cells may have the same width or different widths.

In the embodiment of FIG. 1a and FIG. 1b, the wavelength conversion cells include the first and second wavelength conversion cells. However, the disclosed technology is not limited thereto, and the color converting element may include three or more wavelength conversion cells having different characteristics. For example, if a color converting element includes first to third wavelength conversion cells, green, red and blue color conversion cells may be provided as the wavelength conversion cells, respectively, and various other modifications can be made.

Next, a method for manufacturing a color converting element according to one embodiment of the disclosed technology will be described with reference to FIGS. 2a to 2f.

A first color converting element 34 is formed, which is composed of or includes a first material containing glass. A first convex-concave pattern is generated on one surface of the first color converting element 34 to form the patterned first color converting element 34' (see FIGS. 2a and 2b). The forming of the patterned first color converting element 34' may be performed by, for example, compressing powder of the first material using a mold 100 and a mold 101 having a pattern corresponding to the first convex-concave pattern.

Figure 2A:
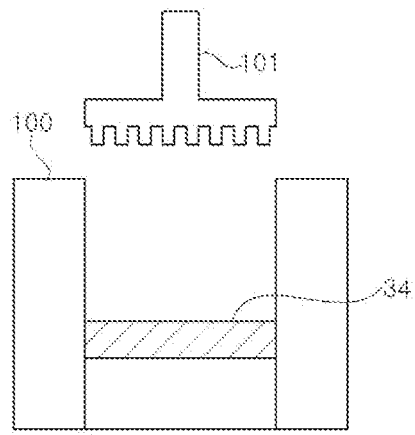
FIG. 2a to FIG. 2f are sectional views illustrating a method for manufacturing a color converting element according to some embodiments of the disclosed technology.
Figure 2B:
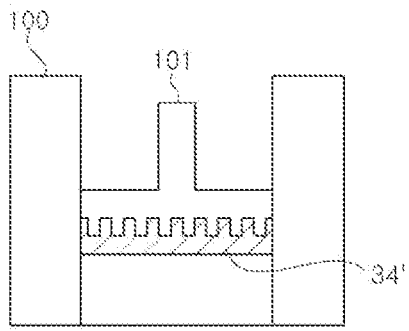
Figure 2C:
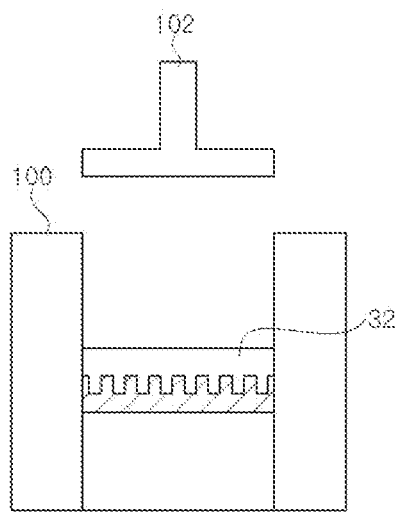
Figure 2D:
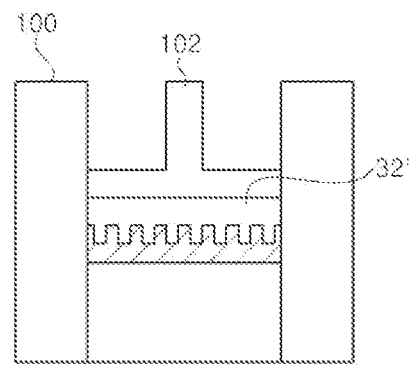
Figure 2E:
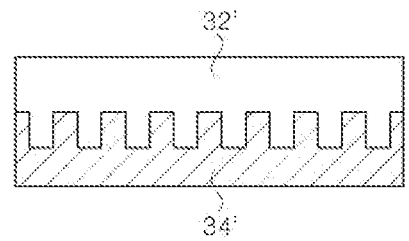
Figure 2F:
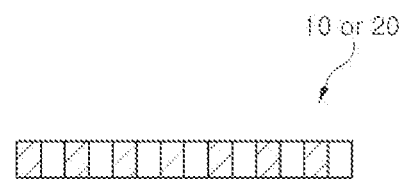

A second color converting element 32 is formed, which is composed of or includes a second material containing glass. A second convex-concave pattern is formed on one surface of the second color converting element 32 to provide the patterned second color converting element 32'. The forming of the patterned second color converting element 32' may be performed by, for example, placing powder of the second material on the first convex-concave pattern of the compressed first color converting element (see FIG. 2c), followed by compressing the powder of the second material using a mold 102 having no lattice pattern (see FIGS. 2a and 2b). The first convex-concave pattern and the second convex-concave pattern are engaged to form an engaging portion (see FIGS. 2c, 2d and 2e). The first and second color converting elements are partially removed while remaining the engaging portion of the first and second convex-concave patterns. As shown in FIG. 2f, the remained engaging portion has exposed bottom and top surfaces. (See FIG. 2f).

In some implementations, the color converting element has a particle size of 100 μm or less, or 50 μm or less. The powder with a particle size of 100 μm or less facilitates forming a desired lattice shape in the process of forming the color converting element.

In some implementations, the first and second color converting elements 32' and 34' are sintered in an engaged state. Sintering is performed at a temperature higher than or equal to transition temperatures of the first and second materials of the first and second color converting elements that are engaged with each other.

The first and second color converting elements are partially removed through grinding of upper and lower portions of the first and second color converting elements such that the engaging portion of the first and second convex-concave patterns has exposed top and bottom surfaces (FIG. 2f), thereby providing a completed color converting element.

Figure 4:
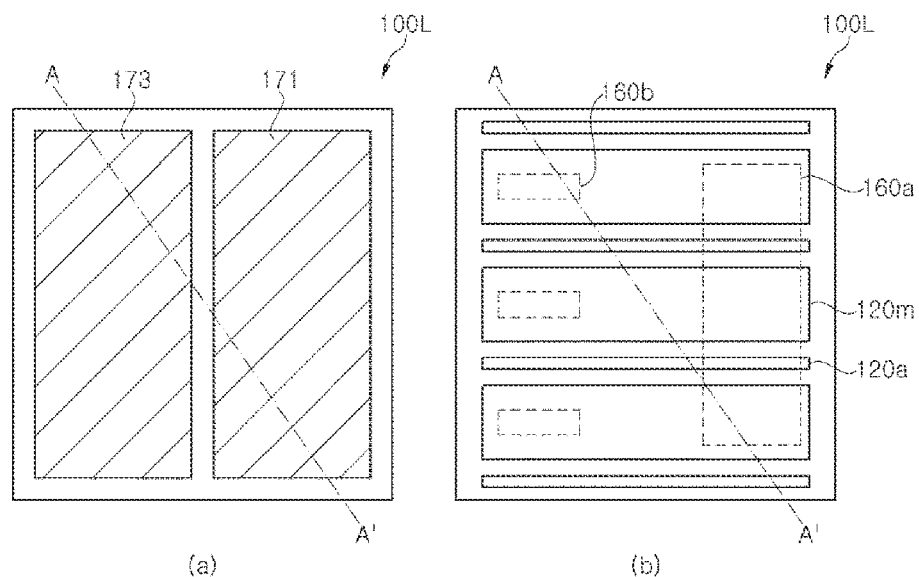
FIG. 4 are plan views of an exemplary light emitting diode included in a light emitting device according to some embodiments of the disclosed technology.
Figure 5:
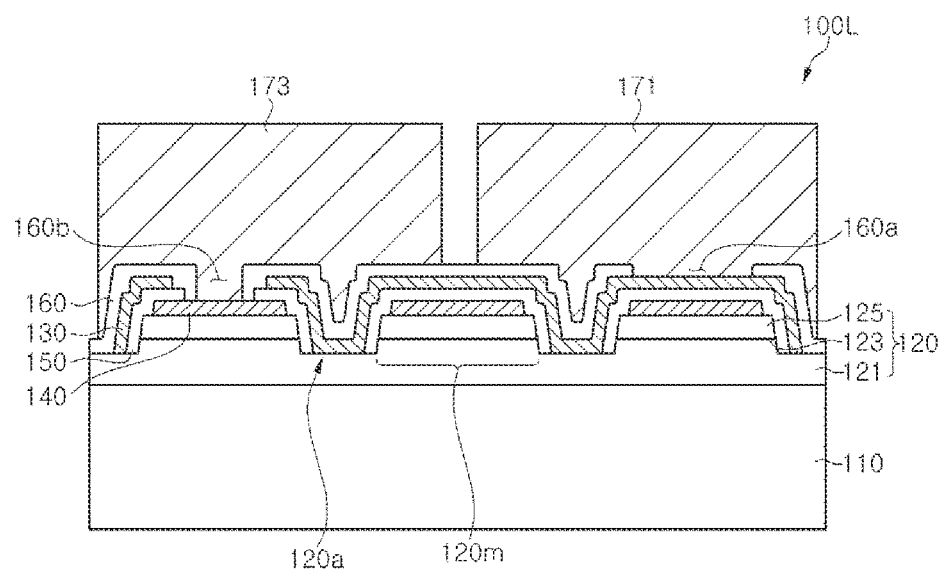
FIG. 5 is a cross-sectional view of an exemplary light emitting diode included in a light emitting device according to some embodiments of the disclosed technology.
Figure 6A:
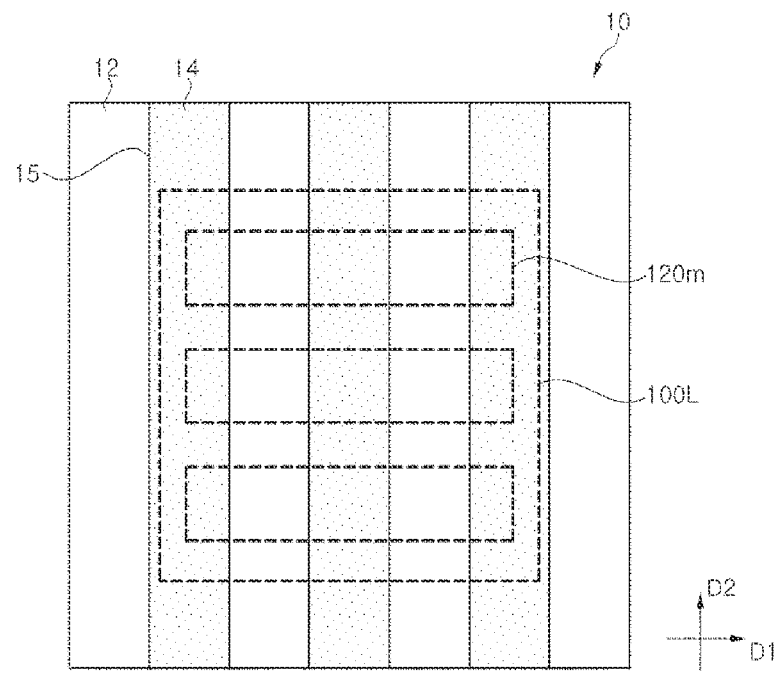
FIG. 6a and FIG. 6b are plan views illustrating an exemplary arrangement of a color converting element and a light emitting diode in a light emitting device according to one embodiment of the disclosed technology.
Figure 6B:
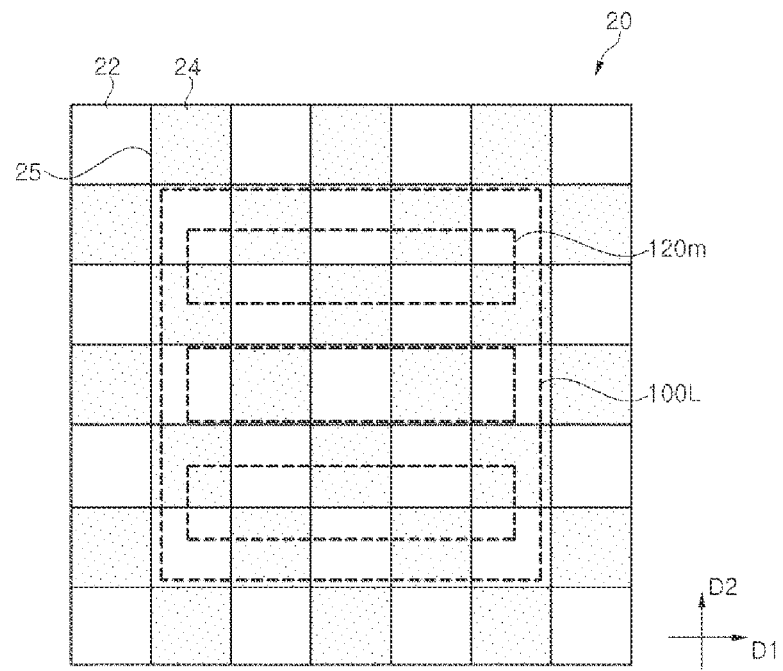

FIG. 3 is a sectional view of a light emitting device including color converting elements according to one embodiment of the disclosed technology; FIG. 4 and FIG. 5 are plan views and a sectional view of a light emitting diode applied to a light emitting device according to one embodiment of the disclosed technology; and FIG. 6a and FIG. 6b are plan views illustrating an arrangement of color converting elements and light emitting diodes in a light emitting device according to one embodiment of the disclosed technology.

Referring to FIG. 3, the light emitting device according to this embodiment includes a color converting element 10 or 20, a light emitting diode 100L, and a substrate 200. The light emitting device may further include a distributed Bragg reflector 300. The light emitting diode 100L may be disposed on the substrate 200 and the color converting element 10 or 20 may be disposed on the light emitting diode 100L. The distributed Bragg reflector 300 may be disposed between the light emitting diode 100L and the color converting element 10 or 20.

The substrate 200 may be disposed on a lower side of the light emitting device to support the light emitting diode 100L. The substrate 200 incudes a base 210 and a conductive pattern 220, and may further include an insulation pattern 230.

The base 210 may act as a support plate of the substrate 200. The base 210 may be formed of or include a conductive or insulating material, which may have good thermal conductivity. Other implementations are also possible regarding material of the base 210. For example, the base 210 may include a metallic material such as Ag, Cu, Au, Al, or Mo, and the like. In addition, the base 210 may be composed of or include a single layer or multiple layers. Alternatively, the base 210 may be formed of or include a ceramic insulating material, such as AlN.

The conductive pattern 220 is disposed on the base 210. The conductive pattern 220 may include at least two types of conductive patterns and may include a first conductive pattern 221 and a second conductive pattern 223 separated and insulated from each other. The conductive pattern 220 may be electrically connected to the light emitting diode 100L, as described below. The conductive pattern 220 may act as an electrical circuit or as a lead of the light emitting device. The conductive pattern 220 may include an electrically conductive material, and may include a metallic material, for example, Ni, Pt, Pd, Rh, W, Ti, Al, Mg, Ag, Cr, or Au, and the like. The conductive pattern 220 may be composed of or include a single layer or multiple layers.

The insulation pattern 230 may be disposed between the conductive pattern 220 and the base 210. The insulation pattern 230 prevents electrical connection between the base 210 and the conductive pattern 220 to prevent electrical short of the first and second conductive patterns 221 and 223 through the base 210. When the base 210 is formed of or includes an insulating material, the insulation pattern 230 may be omitted.

The light emitting diode 100L is disposed on the substrate 200 and may be electrically connected to the conductive pattern 220 of the substrate 200. Now, the light emitting diode 100L will be described in detail with reference to FIGS. 4 and 5.

FIG. 4(a) is a plan view of the light emitting diode 100L and FIG. 4(b) is a plan view illustrating locations of a mesa 120m, a contact area 120a of a first contact electrode 130, and first and second openings 160a and 160b. FIG. 5 is a sectional view taken along line A-A' of FIG. 4.

Referring to FIGS. 4 and 5, the light emitting diode 100L includes a light emitting structure 120, a first contact electrode 130, a second contact electrode 140, insulation layers 150 and 160, and first and second pad electrodes 171 and 173.

The light emitting structure 120 includes a first conductive type semiconductor layer 121, an active layer 123 disposed over the first conductive type semiconductor layer 121, and a second conductive type semiconductor layer 125 disposed over the active layer 123. The first conductive type semiconductor layer 121, the active layer 123 and the second conductive type semiconductor layer 125 may include a III-V based compound semiconductor, and may include, for example, a nitride semiconductor such as (Al, Ga, In)N. The first conductive type semiconductor layer 121 may include n-type impurities (for example, Si) and the second conductive type semiconductor layer 125 may include p-type impurities (for example, Mg), or vice versa. The active layer 123 may have a multi-quantum well (MQW) structure and the composition of the active layer may be determined to emit light having a desired peak wavelength.

The light emitting structure 120 may include a partially exposed region of the first conductive type semiconductor layer 121, which is formed by partially removing the second conductive type semiconductor layer 125 and the active layer 123. As shown in FIG. 4, the partially exposed region of the first conductive type semiconductor layer 121 may be formed by partially removing the second conductive type semiconductor layer 125 and the active layer 123 to form the mesa 120m that includes the second conductive type semiconductor layer 125 and the active layer 123. The light emitting structure 120 may include a plurality of mesas 120m, which may have an elongated shape extending in one direction.

Since the active layer 123 is included in the mesas 120m, a luminous pattern of the light emitting diode corresponds to the locations of the mesas 120m when the mesas 120m have an elongated shape extending in one direction. In this embodiment, luminous areas of the light emitting diode are created along the mesas 120m, whereby light emission can occur in the areas having an elongated shape extending in the same direction. It should be understood that the disclosed technology is not limited thereto.

The light emitting structure 120 may further include a growth substrate 110 disposed under the first conductive type semiconductor layer 121. The growth substrate 110 may be selected from any substrate capable of growing the light emitting structure 120 thereon, and may include, for example, a sapphire substrate, a silicon carbide substrate, a silicon substrate, a gallium nitride substrate, or an aluminum nitride substrate, and the like.

The second contact electrode 140 is disposed over the second conductive type semiconductor layer 125 and may form ohmic contact with the second conductive type semiconductor layer 125. In addition, the second contact electrode 140 may at least partially cover an upper surface of the second conductive type semiconductor layer 125, and may be disposed to cover an overall upper surface of the second conductive type semiconductor layer 125. Thus, the second contact electrode 140 may be disposed on the mesas 120m.

The second contact electrode 140 may be formed of a material capable of forming ohmic contact with the second conductive type semiconductor layer 125, and may include, for example, a metallic material and/or a conductive oxide. When the second contact electrode 140 includes a metallic material, the second contact electrode 140 may include a reflective material and a cover layer covering the reflective material. As described above, the second contact electrode 140 may form ohmic contact with the second conductive type semiconductor layer 125 while reflecting light. Thus, the reflective material may include a metal having high reflectivity and capable of forming ohmic contact with the second conductive type semiconductor layer 125. For example, the reflective material may include at least one of Ni, Pt, Pd, Rh, W, Ti, Al, Mg, Ag or Au. In addition, the reflective material may include a single layer or multiple layers. The cover layer can prevent inter-diffusion between the reflective material and other materials, and can prevent damage to the reflective material caused by diffusion of other external materials into the reflective material. Thus, the cover layer may be formed to cover a lower surface and a side surface of the reflective material. In addition to the reflective material, the cover layer may also be electrically connected to the second conductive type semiconductor layer 125 and thus can act as an electrode together with the reflective material. The cover layer may include, for example, Au, Ni, Ti, or Cr, and the like, and may be composed of or include a single layer or multiple layers. The reflective material and the cover layer may be formed by e-beam deposition, or plating, and the like.

When the second contact electrode 140 includes a conductive oxide, the conductive oxide may be or include ITO, ZnO, AZO, or IZO, or the like. The second contact electrode 140 including the conductive oxide can cover a wider area of the upper surface of the second conductive type semiconductor layer 125 than in the case of including a metal. A distance from an edge of the exposed region of the first conductive type semiconductor layer 121 to the second contact electrode 140 becomes relatively short when the second contact electrode 140 is formed of or includes the conductive oxide. In this case, the shortest distance from a contact portion between the second contact electrode 140 and the second conductive type semiconductor layer 125 to a contact portion between the first contact electrode 130 and the first conductive type semiconductor layer 121 can be further reduced, thereby reducing forward voltage Vf of the light emitting diode 100L.

In addition, when the second contact electrode 140 includes ITO, a first insulation layer 150 includes SiO2 and the first contact electrode 130 includes Ag, an omnidirectional reflector including a stack structure of ITO/SiO2/Ag can be formed.

The insulation layers 150 and 160 may partially cover the first and second contact electrodes 130 and 140 while insulating the first contact electrode 130 from the second contact electrode 140. The insulation layers 150 and 160 may include a first insulation layer 150 and a second insulation layer 160.

The first insulation layer 150 may partially cover an upper surface of the light emitting structure 120 and the second contact electrode 140. In addition, the first insulation layer 150 may cover side surfaces of the mesas 120m while partially exposing the first conductive type semiconductor layer 121 around the mesas 120m. Thus, the first insulation layer 150 may include an opening corresponding to the partially exposed region of the first conductive type semiconductor layer 121 and an opening through which the second contact electrode 140 is partially exposed. An ohmic contact region 120a between the first conductive type semiconductor layer 121 and the first contact electrode 130 may be formed through the opening through which the first conductive type semiconductor layer 121 is partially exposed.

The first insulation layer 150 may include an insulating material and may include, for example, $SiO_2$, $SiN_x$, or $MgF_2$, and the like. In addition, the first insulation layer 150 may include multiple layers, and may include a distributed Bragg reflector formed by alternately stacking materials having different indexes of refraction.

When the second contact electrode 140 includes a conductive oxide, the first insulation layer 150 includes the distributed Bragg reflector to improve luminous efficiency of the light emitting diode 100L. Alternatively, when the second contact electrode 140 includes the conductive oxide, the first insulation layer 150 may be formed of or include a transparent insulation oxide (for example, $SiO_2$) to form an omnidirectional reflector having a stack structure of the second contact electrode 140, the first insulation layer 150 and the first contact electrode 130. In this case, the first contact electrode 130 may be formed to cover substantially the entirety of the surface of the first insulation layer 150 excluding a region for partially exposing the second contact electrode 140. As a result, a part of the first insulation layer 150 can be interposed between the first contact electrode 130 and the second contact electrode 140.

The first insulation layer 150 may be formed to further cover a side surface of at least part of the light emitting structure 120. The degree covering the side surface of the light emitting structure 120 by the first insulation layer 150 may depend upon the isolation of unit chips in the fabrication process of the light emitting diode. In this embodiment, the first insulation layer 150 may be formed to cover only the upper surface of the light emitting structure 120. Alternatively, when the first insulation layer 150 is formed after the isolation of a wafer into unit chips in the fabrication process of the light emitting diode 100L, the first insulation layer 150 may be formed to cover the side surface of the light emitting structure 120.

The first contact electrode 130 may be formed to partially cover the light emitting structure 120. In addition, the first contact electrode 130 forms ohmic contact with the first conductive type semiconductor layer 121 through the opening of the first insulation layer 150, which exposes an ohmic contact region 120a. In this embodiment, the first contact electrode 130 may be formed to cover the first insulation layer 150 excluding some regions thereof. Accordingly, light can be reflected through the first contact electrode 130. Further, the first contact electrode 130 may be electrically insulated from the second contact electrode 140 by the first insulation layer 150.

As the first contact electrode 130 is formed in some regions to cover the overall upper surface of the light emitting structure 120, the light emitting diode can have further improved current spreading efficiency. Further, since the first contact electrode 130 can cover a portion which is not covered by the second contact electrode 140, light can be more efficiently reflected through the first contact electrode 130, thereby improving luminous efficiency of the light emitting diode 100L.

As described above, the first contact electrode 130 may serve to reflect light while forming ohmic contact with the first conductive type semiconductor layer 121. Accordingly, the first contact electrode 130 may include a highly reflective metal layer such as an Al layer. Here, the first contact electrode 130 may be composed of or include a single layer or multiple layers. The highly reflective metal layer may be formed on a bonding layer such as a Ti, Cr or Ni layer. It should be understood that the disclosed technology is not limited thereto and the first contact electrode 130 may include at least one of Ni, Pt, Pd, Rh, W, Ti, Al, Mg, Ag or Au.

Alternatively, although not shown, the first contact electrode 130 may be formed to cover the side surface of the light emitting structure 120 as well as the upper surface of the light emitting structure 120. The first contact electrode 130 formed on the side surface of the light emitting structure 120 reflects light, which has been emitted from the active layer 123 and passed through the side surface of the light emitting diode, in an upward direction, thereby increasing the ratio of light emitted through the upper surface of the light emitting diode 100L. When the first contact electrode 130 is formed to cover the side surface of the light emitting structure 120 as well as the upper surface of the light emitting structure 120, a first insulation layer 150 may be interposed between the side surface of the light emitting structure 120 and the first contact electrode 130.

The light emitting diode 100L may further include a connection electrode (not shown). The connection electrode may be disposed on the second contact electrode 140 and electrically connected to the second contact electrode 140 through the opening of the first insulation layer 150. An upper surface of the connection electrode may be generally flush with an upper surface of the first contact electrode 130. Further, the connection electrode may be formed by the same process as the process of forming the first contact electrode 130, and may include the same material as that of the first contact electrode 130. It should be understood that the disclosed technology is not limited thereto and the connection electrode and the first contact electrode 130 may include different materials.

The second insulation layer 160 may partially cover the first contact electrode 130, and may include a first opening 160a, which partially exposes the first contact electrode 130, and a second opening 160b, which partially exposes the second contact electrode 140. Each of the first and second openings 160a and 160b may be provided in a singular or plural number.

The second insulation layer 160 may include an insulating material, for example, $SiO_2$, $SiN_x$, or $MgF_2$, and the like. In addition, the second insulation layer 160 may include multiple layers, and may include a distributed Bragg reflector formed by alternately stacking materials having different indexes of refraction. When the second insulation layer 160 is composed of or includes multiple layers, the uppermost layer of the second insulation layer 160 may be formed of or include $SiN_x$. As the uppermost layer of the second insulation layer 160 is formed of or includes $SiN_x$, it is possible to prevent infiltration of moisture into the light emitting structure 120.

Each of the first and second pad electrodes 171 and 173 may be electrically connected to the first and second contact electrodes 130 and 140 through the first and second openings 160a and 160b, respectively. The first and second pad electrodes 171 and 173 may serve to provide external power to the light emitting structure 120 therethrough. The first and second pad electrodes 171 and 173 may be electrically connected to the substrate 200. Each of the first and second pad electrodes 171 and 173 may be electrically connected to first and second conductive patterns 221 and 223 of the substrate 200. Pad electrodes 171 and 173 may be electrically connected to the conductive pattern 220 through soldering or eutectic bonding.

The color converting element 10 or 20 is disposed over the light emitting diode 100L. As described in FIGS. 1 to 2f, the color converting element 10 or 20 may convert the wavelength of light emitted from the light emitting diode 100L.

The color converting element 10 or 20 may have a greater size than the upper surface of the light emitting diode 100L. The whole upper surface of the light emitting diode 100L may be covered by the color converting element 10 or 20, whereby the side surfaces of the color converting element 10 or 20 can protrude, as compared with the side surfaces of the light emitting diode 100L. In this way, since the color converting element 10 or 20 is formed to have a greater size than the light emitting diode 100L, light emitted through the side surface of the light emitting diode 100L is allowed to more easily enter the color converting element 10 or 20. Accordingly, the ratio of light not passing through the color converting element 10 or 20 to the light emitted from the light emitting diode 100L can be reduced. However, it should be understood that the disclosed technology is not limited thereto and the color converting element 10 or 20 may be separated a certain distance from the light emitting diode 100L.

In addition, the wavelength conversion cells 12 and 14 or 22 and 24 of the color converting element 10 or 20 may be arranged in a certain direction. In this case, at least some of interfaces 15 or 25 between the first wavelength conversion cells 12 or 22 and the second wavelength conversion cells 14 or 24 may extend in a certain direction, which is not parallel to the extension direction of the luminous areas of the light emitting structure 120.

For example, referring to FIG. 6a, the luminous areas of the light emitting diode 100L, for example, the mesas 120m, are arranged in an elongated shape in the first direction D1. Accordingly, light emitted from the light emitting diode 100L passes through regions corresponding to locations of the mesas 120m. The color converting element 10 disposed over the light emitting diode 100L includes the first and second wavelength conversion cells 12 and 14, which are arranged in a stripe pattern. The wavelength conversion cells 12 and 14 arranged in the stripe pattern may be disposed to extend in a second direction D2. Accordingly, the interface 15 between the wavelength conversion cells 12 and 14 may also extend in the second direction D2. Here, the first direction D1 is not parallel to the second direction D2 and may be generally perpendicular to the second direction D2, as shown in the drawings. It should be understood that the disclosed technology is not limited thereto and any embodiments of the first direction D1 not parallel to the second direction D2 fall within the scope of the disclosed technology.

In this way, the color converting element 20 may be disposed such that the extension direction of the luminous areas having an elongated shape is not parallel to the extension direction of the interface 15 between the wavelength conversion cells 12 and 14. As a result, light emitted from the light emitting diode 100L can evenly enter the first and second wavelength conversion cells 12 and 14 of the color converting element 20, thereby reducing color deviation of light emitted from the light emitting device.

Specifically, light emitted from the light emitting diode 100L is further focused on an upper portion of the luminous area (that is, the mesa 120m), and when the first direction D1 is coincident with the second direction D2, the light is focused on the wavelength conversion cell 12 or 14 disposed on the mesa 120m. Accordingly, in a specific case, light can be focused only on the first wavelength conversion cell 12 or only on the second wavelength conversion cell 14. In this case, the ratio of light converted by wavelength conversion cells having low intensity of incident light is reduced, thereby causing variation in color characteristics of light emitted from the light emitting device from a target level. In addition, deviation between color characteristics of light emitted from light emitting devices is increased. On the contrary, according to this embodiment, the color converting element 20 is disposed such that the extension direction of the luminous areas having an elongated shape is not parallel to the extension direction of the interfaces 15 between the wavelength conversion cells 12 and 14, whereby the color characteristics of light emitted from the light emitting device can reach a target level. Furthermore, it is possible to minimize deviation between the color characteristics of the plurality of light emitting devices.

Further, as shown in FIG. 6b, the aforementioned structure may also be applied to the color converting element 20 in which the wavelength conversion cells are arranged in a lattice pattern. Referring to FIG. 6b, the luminous areas of the light emitting diode 100L, for example, the mesas 120m, are arranged in an elongated shape in the first direction D1. The color converting element 20 includes the first and second wavelength conversion cells 22 and 24, which are arranged such that at least some of the interfaces between the first and second wavelength conversion cells 22 and 24 extend in the second direction. Here, the first direction D1 is not parallel to the second direction D2 and may be generally perpendicular to the second direction D2.

The distributed Bragg reflector 300 may be disposed between the light emitting diode 100L and the color converting element 10 or 20.

The distributed Bragg reflector 300 can selectively reflect light depending upon the wavelength of light. The distributed Bragg reflector 300 transmits light having a relatively short wavelength while reflecting light having a relatively long wavelength. For example, when the light emitting diode 100L emits light having a relatively short wavelength, for example, blue light, and the color converting element 10 or 20 emits light having a relatively long wavelength, for example, green light or yellow light, through conversion of the blue light, the distributed Bragg reflector 300 transmits the light emitted from the light emitting diode 100L while reflecting the light to be subjected to wavelength conversion through the color converting element 10 or 20. As a result, it is possible to prevent the light to be subjected to wavelength conversion through the color converting element 10 or 20 from being absorbed into the light emitting diode 100L at a lower side of the distributed Bragg reflector. With this structure, the light emitting device according to this embodiment can have improved luminous efficiency.

Further, the distributed Bragg reflector 300 may include a first distributed Bragg reflector 310 and a second distributed Bragg reflector 320 disposed over the first distributed Bragg reflector 310. The first distributed Bragg reflector 310 may reflect light having a wavelength less than or equal to a first wavelength while transmitting light having a wavelength longer than or equal to the first wavelength. The second distributed Bragg reflector 320 may reflect light having a wavelength shorter than or equal to a second wavelength while transmitting light having a wavelength longer than or equal to the second wavelength therethrough. The first wavelength is shorter than the first wavelength.

For example, the first distributed Bragg reflector 310 reflects green light and light having a longer wavelength than the green light, while transmitting light having a shorter wavelength than the green light. The second distributed Bragg reflector 320 reflects yellow light and light having a longer wavelength than the yellow light, while transmitting light having a shorter wavelength than the yellow light.

Accordingly, light, the wavelength of which is converted by the color converting element 10 or 20, can be reflected stepwise depending upon the wavelength of light by the first and second distributed Bragg reflectors 310 and 320. As a result, reabsorption of the wavelength-converted light into the light emitting diode 100L can be more effectively prevented.

Although some embodiments have been described herein, it should be understood that the disclosed technology is not limited to the embodiments and features described above, and that various modifications, variations and alterations can be made without departing from the spirit and scope of the disclosed technology.

What is claimed is:

1. A light emitting device comprising:
   a substrate;
   a light emitting diode disposed over the substrate and including a light emitting structure, the light emitting structure including a first conductive type semiconductor layer, a second conductive type semiconductor layer and an active layer disposed between the first conductive type semiconductor layer and the second conductive type semiconductor layer; and
   a color converting element disposed over the light emitting diode,
   wherein the light emitting structure includes an elongated shape extending in a first direction and includes a mesa including the second conductive type semiconductor layer and the active layer,
   wherein the color converting element includes:
      a plurality of first wavelength conversion cells separated from one another; and
      a plurality of second wavelength conversion cells each disposed between the first wavelength conversion cells, and
   wherein at least one of interfaces between the first wavelength conversion cells and the second wavelength conversion cells has an elongated shape extending in a second direction, and the first direction is not parallel to the second direction.

2. The light emitting device of claim 1, wherein the first and second wavelength conversion cells are arranged in a stripe pattern.

3. The light emitting device of claim 2, wherein the first direction is substantially perpendicular to the second direction.

4. The light emitting device of claim 1, wherein the first and second wavelength conversion cells are arranged in a lattice pattern.

5. The light emitting device of claim 1, wherein the color converting element has a greater horizontal cross-sectional area than an upper surface of the light emitting diode.

6. The light emitting device of claim 5, wherein the upper surface of the light emitting diode is covered by the color converting element.

7. The light emitting device of claim 1, wherein the first and second wavelength conversion cells includes a glass containing material.

8. The light emitting device of claim 7, wherein the glass containing material includes a ceramic phosphor-containing glass or crystallized glass material.

9. The light emitting device of claim 7, wherein the glass containing material includes an active ion for color conversion, quantum dot or nanocrystal-containing glass or crystallized glass material.

10. The light emitting device of claim 1, wherein the color converting element further includes a plurality of third wavelength conversion cells separated from one another, and each of the third wavelength conversion cells is disposed between the first wavelength conversion cells and the second wavelength conversion cells.

11. The light emitting device of claim 1, wherein the light emitting diode includes:
    a first contact electrode and a second contact electrode disposed over the light emitting structure and forming ohmic contact with the first and second conductive type semiconductor layers, respectively;
    an insulation layer insulating the first contact electrode and the second contact electrode while partially covering the first and second contact electrodes; and
    first and second pad electrodes disposed over the insulation layer and electrically connected to the first and second contact electrodes, respectively.

12. The light emitting device of claim 11, wherein the second contact electrode is disposed over the mesa.

13. The light emitting device of claim 12, wherein the first contact electrode forms ohmic contact with the first conductive type semiconductor layer around the mesa, and an ohmic contact area between the first contact electrode and the first conductive type semiconductor layer has an elongated shape extending in the first direction.

14. The light emitting device of claim 1, wherein the first and second wavelength conversion cells have the same or different widths less than or equal to 300 µm.

15. The light emitting device of claim 1, further including:
    a distributed Bragg reflector disposed between the color converting element and the light emitting diode.

16. The light emitting device of claim 15, wherein the distributed Bragg reflector transmits light emitted from the light emitting diode and reflects light emitted from the color converting element and is subjected to wavelength conversion in the color converting element.

17. The light emitting device of claim 15, wherein the distributed Bragg reflector includes a first distributed Bragg reflector and a second distributed Bragg reflector disposed over the first distributed Bragg reflector, and the first distributed Bragg reflector reflects light having a shorter wavelength than the second distributed Bragg reflector.

* * * * *